United States Patent
Peterson et al.

(10) Patent No.: US 9,678,383 B1
(45) Date of Patent: Jun. 13, 2017

(54) METHOD AND APPARATUS FOR LIGHT DIFFUSION

(71) Applicant: Rohinni, Inc., Coeur d' Alene, ID (US)

(72) Inventors: Cody Peterson, Hayden, ID (US); Andrew Huska, Liberty Lake, WA (US); Monica Hansen, Santa Barbara, CA (US); Clinton Adams, Coeur d' Alene, ID (US)

(73) Assignee: Rohinni, LLC, Coeur d' Alene, ID (US)

( * ) Notice: Subject to any disclaimer, the term of this patent is extended or adjusted under 35 U.S.C. 154(b) by 0 days.

(21) Appl. No.: 15/075,001

(22) Filed: Mar. 18, 2016

(51) Int. Cl.
*G09F 13/04* (2006.01)
*G02F 1/1335* (2006.01)

(52) U.S. Cl.
CPC .. *G02F 1/133606* (2013.01); *G02F 1/133603* (2013.01); *G02F 1/133605* (2013.01)

(58) Field of Classification Search
CPC .................................................. G02B 6/0031
See application file for complete search history.

(56) References Cited

U.S. PATENT DOCUMENTS

| | | | |
|---|---|---|---|
| 2007/0086211 A1* | 4/2007 | Beeson | G02F 1/133603 362/628 |
| 2007/0138494 A1* | 6/2007 | Pugh | G02B 6/0021 257/98 |
| 2011/0175518 A1* | 7/2011 | Reed | F21V 7/05 313/483 |
| 2011/0317417 A1* | 12/2011 | Gourlay | G02B 6/0043 362/235 |
| 2012/0224111 A1* | 9/2012 | Ohshima | G02F 1/133603 348/790 |

\* cited by examiner

*Primary Examiner* — Andrew Coughlin
(74) *Attorney, Agent, or Firm* — Lee & Hayes, PLLC

(57) ABSTRACT

An apparatus includes a substrate and an LED attached to the substrate via conductive pads on a first side of the LED. The LED includes a first reflective element disposed adjacent the first side of the LED so as to reflect light in a direction away from the substrate, and a second reflective element disposed adjacent a second side of the LED that opposes the first side of the LED. The second reflective element disposed so as to reflect light primarily in a direction toward the substrate.

24 Claims, 10 Drawing Sheets

METHOD AND APPARATUS FOR LIGHT DIFFUSION

CROSS REFERENCE TO RELATED PATENT APPLICATIONS

This application incorporates U.S. patent application Ser. No. 14/939,896, filed on Nov. 12, 2015, entitled "Method and Apparatus for Transfer of Semiconductor Devices," in its entirety by reference.

BACKGROUND

A basic Liquid-Crystal Display (LCD) is structured in layers. An LCD has a mirror in back, which makes it reflective. Then, a piece of glass with a polarizing film on the bottom side and a common electrode plane made of indium-tin oxide on top is added. A common electrode plane covers the entire area of the LCD. Above that is a layer of liquid crystal substance. Next comes another piece of glass with an electrode on the bottom and, on top, another polarizing film disposed at a right angle to the first polarizing film.

The electrodes are hooked up to a power source. When there is no current applied, light entering through the front of the LCD will simply hit the mirror and bounce right back out. But when the power source supplies current to the electrodes, the liquid crystals between the common electrode plane and the electrode shaped like a rectangle untwist and block the light in that region from passing through. That makes the LCD show the display as a black color.

The pixels of an LCD that can show colors typically have three subpixels with red, green, and blue color filters to create each color pixel. Through the control and variation of the voltage applied to the subpixels, the intensity of each subpixel can range over multiple shades (e.g., 256 shades). Combining the subpixels produces a possible palette of many more (e.g., 16.8 million colors (256 shades of red×256 shades of green×256 shades of blue)).

LCD technology is constantly evolving. LCDs today employ several variations of liquid crystal technology, including super twisted nematics (STN), dual scan twisted nematics (DSTN), ferroelectric liquid crystal (FLC), and surface stabilized ferroelectric liquid crystal (SSFLC).

Furthermore, in general, light sources for providing light to the LCD are typically placed in one of two places. In some instances, along the edge of an LCD may be a cold cathode fluorescent (CCFL) or an array of light-emitting diodes (LEDs), forming what is often termed as an "edge-lit" LCD because the light is emitted into a side edge of a diffuser. In other instances, light sources may be arranged in an array or matrix behind the plane of the front of the display, forming what is often termed as a "back-lit" LCD because the light is emitted into the diffuser from a back surface of the display. In either case, using an optical system including a diffuser to spread out the light, these lights backlight the pixels of the display. Indeed, these lights are typically the only lights in the display.

The optical system includes a first sheet that makes a white background for the light. The next piece is called a "light-guide plate" (LGP) or coversheet. When light enters from the edge of the LGP in an edge-lit display, the light propagates through the length and width of the plate by total internal reflection, unless it hits one of many dots within the LGP. The dots make some of the light rays emerge out the front. Next, a diffuser film is added to help eliminate the dot pattern from the light-guide plate. After that a "prism film" may be added. This is used because light from the backlight emerges not only perpendicular to the back surface, but also at oblique angles. This prism film increases the perpendicularity of the light emission. Finally, another diffuser film may be added to try to help light the plane of the display surface evenly. Essentially, the purpose of the LGP, the prism film, and the diffuser films collectively is to function as a diffuser layer to spread the light emissions of the light sources in an attempt to make the light appear uniform across an entirety of the plane of the display surface, thus minimizing intensity of bright spots at the source point of the light emission.

Regardless of whether an LCD is edge-lit or back-lit, the size of the conventional LEDs used affects the thickness of the LCD, as well as the size of the diffuser needed to diffuse the light.

With regard to the size of the LEDs used in conventional displays, the end result is determined by fabrication and assembly processes according to conventional methods. In particular, the fabrication of the LED semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit. This packaging affects a thickness of the LEDs.

Notably, the conventional fabrication process for semiconductor devices starts with handling a semiconductor wafer. The wafer is diced into a multitude of "unpackaged" semiconductor devices, such as an LED. The "unpackaged" modifier refers to an unenclosed LED without protective features. Herein, unpackaged LEDs may be called "dies" for simplicity. In some instances, a thickness of the unpackaged LEDs may be 50 microns or less.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Overview

This disclosure is directed generally to a method and apparatus for effective and consistent diffusion of light across the plane of the display surface, for example, of a device having an LCD. For example, the instant application provides a description of a method and apparatus with respect to a "nested diffuser." The features described herein of the nested diffuser increase diffusion of light (in comparison to previous methods) while minimizing the number of light sources used to provide a uniform light distribution across the display surface to thereby reduce the cost of manufacturing, and/or minimize a thickness of the display. The term "nested diffuser" is used herein to describe the feature that light diffusion occurs within the same layer of the LCD in which the light is diffused, i.e., within the diffuser at approximately the height/thickness of the light source. In other words, the light sources may be disposed or "nested" within the layer of the LCD that is providing the light diffusion. Hence, the nested diffuser. By disposing the light sources directly within the layer of light diffusion, an overall thickness of the LCD may be reduced.

Furthermore, a thickness of a device on which the method or apparatus of the instant application is applied may be reduced due, at least in part, to the micro size of the light sources used and the manner of light diffusion. In particular, a thickness of the diffuser may be reduced to approximately the height of the light source. In some instances, the light sources may be selected from packaged or unpackaged LEDs. The use of unpackaged LEDs increases the ability to make a thinner display compared to a display using packaged LEDs.

Figure 1:
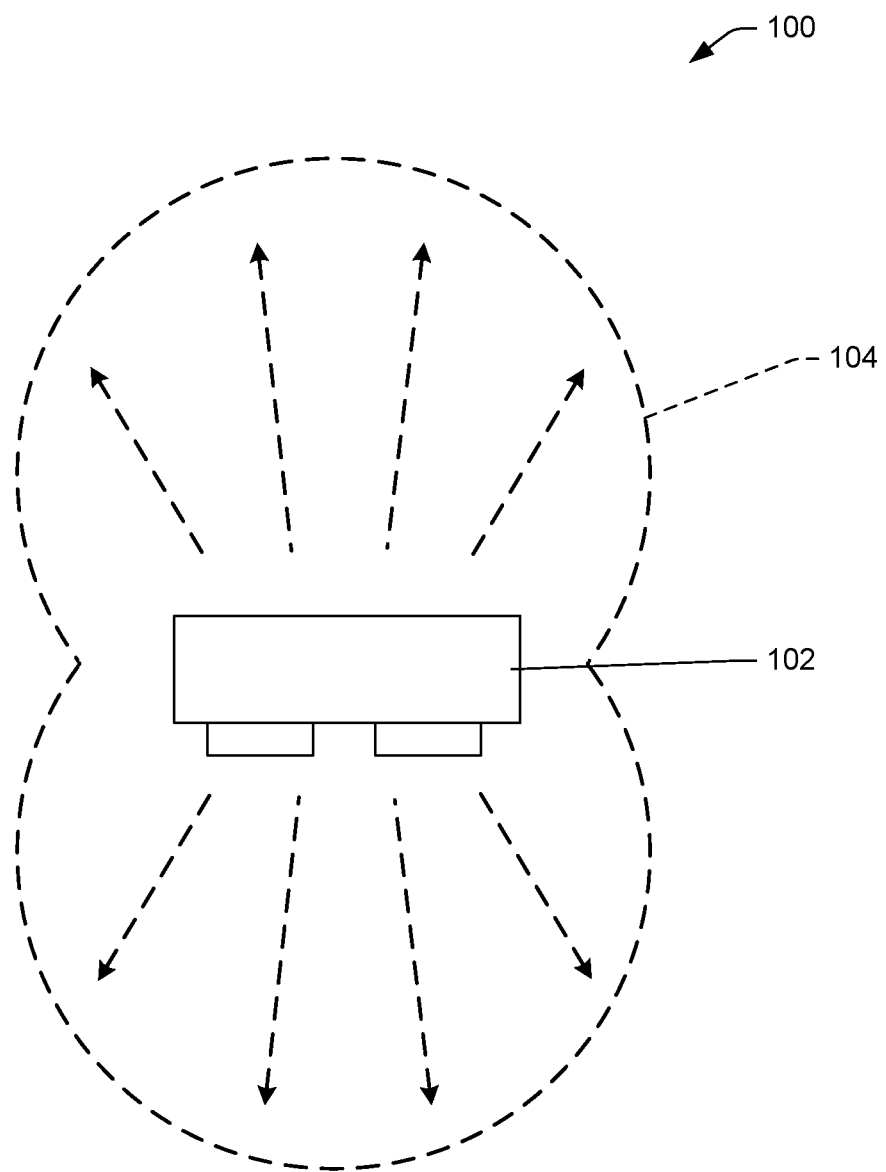
FIG. 1 illustrates how light generally emits from a conventional LED.

FIG. 1 illustrates the approximate pattern of light emission 100 of a conventional LED 102. That is, due to the nature of a conventional LED 102, light is generally emitted in multiple directions surrounding the LED 102. As shown, the light emission pattern 104 depicted for illustrative purposes by the dashed circular and arrow lines indicates that light emits from a top side of the LED 102 and a bottom side of the LED 102, as well as partially from the lateral sides thereof. Note that the light emission pattern 104 may not be limited to the exact pattern as depicted in FIG. 1. In some instances, conventional LED 102 may include a semi-reflective or mirrored surface (not shown) on a single side of the LED 102.

In this conventional configuration, when the LED 102 is attached to a substrate (not shown) having a circuit by which LED 102 is powered to emit light, the light emission pattern 104 of FIG. 1 indicates that roughly half of the light emitted from the LED 102 would be directed toward the substrate to which the LED 102 is connected. Depending on the form and material characteristics of the substrate and the manner in which the substrate is to be implemented in a device using the LED 102, the light emitted toward the substrate is generally lost or has a minimal contribution to the intended purpose of the lighting of the device.

Figure 2:
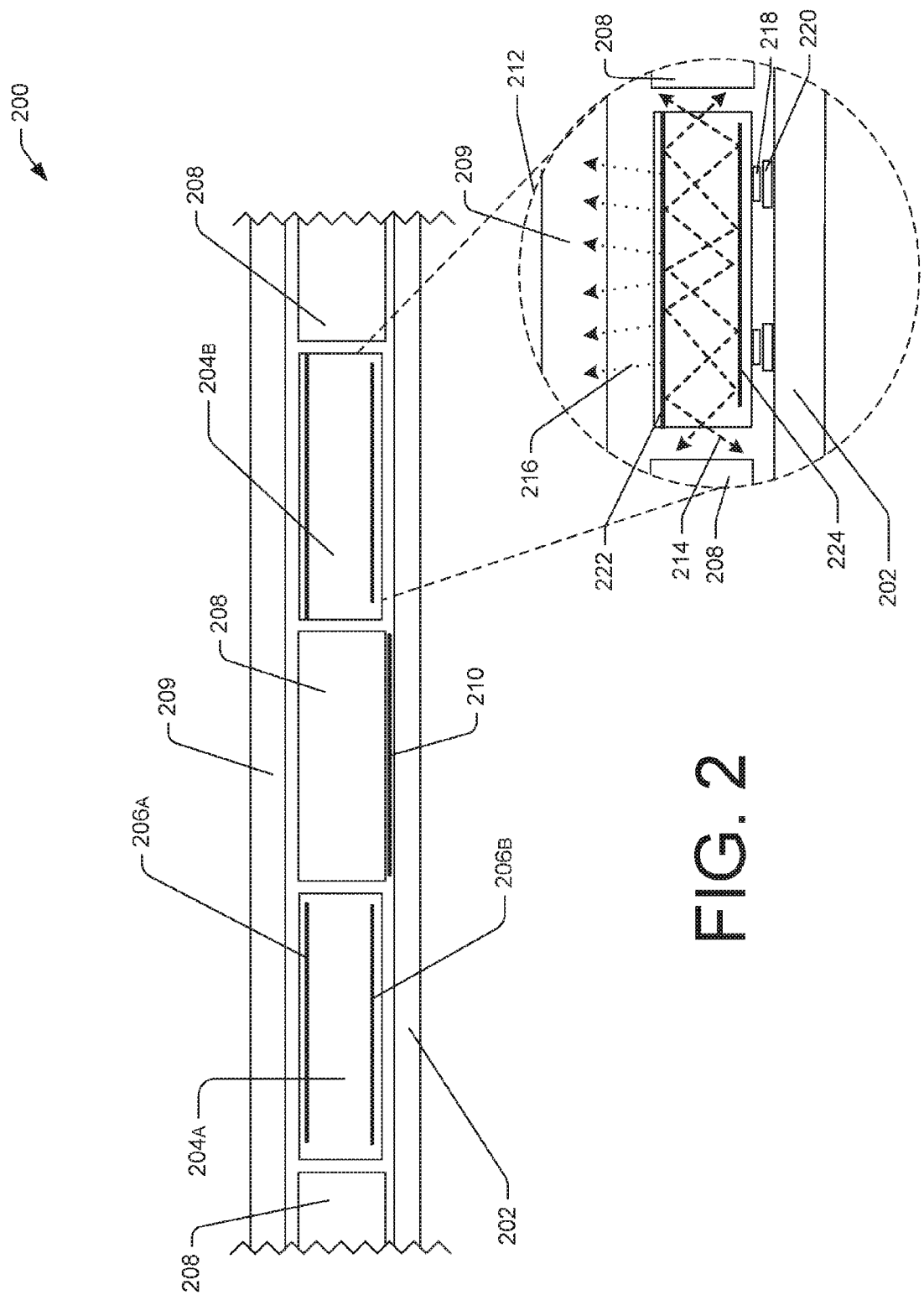
FIG. 2 illustrates a side cross-sectional view of an apparatus according to an embodiment of the instant application.

Illustrative Embodiments of an LED and Nested Diffuser for Uniform Light Diffusion According to an embodiment of the instant application, FIG. 2 illustrates apparatus 200 embodying an array of light sources that may be arranged in a plurality of rows and columns distributed across a plane of a diffuser corresponding to the plane of a display surface, thereby forming a nested diffuser. Additionally and/or alternatively, the light sources may be distributed in a pattern other than rows and columns throughout the diffuser.

In an illustrative embodiment, the apparatus 200 may include a substrate 202 and multiple LEDs (e.g., LEDs 204A, 204B) secured to substrate 202. Note that, in some instances, there may be only one LED. The LEDs 204A, 204B may be standard LEDs having electrical contacts on a top side or may be flip chips having electrical contacts on the bottom side. The substrate 202 includes the circuit traces (shown and discussed in greater detail later) via which the LEDs 204A, 204B are attached to the substrate 202 and powered. Thus, the substrate 202 may be a circuit board, such as a printed circuit board (PCB). Moreover, the substrate 202 may be formed from a polymer as a thin film having a thickness approximately the same as a height of LEDs 204A, 204B. Suitable materials for the substrate 202 include materials, such as PET, which are capable of maintaining structural integrity despite potential temperature changes due to the current flow in one or more LEDs.

The LEDs mounted to the substrate 202 may respectively have different structural configurations depending on technological needs, or all of the LEDs may have similar structural configurations. As depicted, and discussed with respect to LED 204A (LED 204B shows a similar configuration), LED 204A includes a first reflective element 206A and a second reflective element 206B. The first reflective element 206A may be formed on a side of the LED 204A, opposite a side of the LED 204A that is attached to the substrate 202, so as to reflect light toward the substrate. The second reflective element 206B may be formed on the side of the LED 204A that is attached to the substrate 202.

Furthermore, first reflective element 206A and second reflective element 206B may be mirrored surfaces. In some instances, first reflective element 206A and second reflective element 206B are formed by metal mirror contacts. Aluminum (Al) and silver (Ag) are the highest reflectivity metals for a blue LED wavelength range. An omnidirectional reflective element may be made from a stack of dielectric materials with different indices of refraction. These dielectric materials can include $TiO_2$, $SiO_2$, $HfO_2$, $Ta_2O_5$, etc. Additionally, and/or alternatively, a white diffuse polymer-based reflective element material (which may be spun fibers with some $TiO_2$-like particles embedded) may be used. Note that first reflective element 206A and second reflective element 206B may be formed from the same material or different materials. That is, first reflective element 206A may be formed from a first material and second reflective element 206B may be formed from a second material that is different than the first material (e.g., first reflective element 206A may be aluminum and second reflective element 206B may be silver, or vice versa).

Inasmuch as the design and structure of the LEDs described above is useful in directing emitted light, the LEDs 204A, 204B may be implemented as the LEDs in an edge-lit LCD to focus the light emissions into the light guide plate from the edge (not shown), as well as being nested in the diffuser as described herein.

In some instances, the multiple LEDs 204A, 204B may be placed on the substrate 202 first and a diffuser 208 may be aligned with the multiple LEDs 204A, 204B so as to nest the multiple LEDs 204A, 204B within the diffuser 208. Alternatively, the multiple LEDs 204A, 204B may be nested directly in the diffuser 208, which is then aligned with the circuitry on substrate 202. As depicted, a display panel 209 of glass, plastic, or other suitable transparent or translucent material may be placed on a side of the LEDs and diffuser 208 opposite the substrate 202 so as to sandwich the multiple LEDs 204A, 204B and diffuser 208 therebetween. The diffuser 208 acts as a light guide or diffuser plate to assist in uniformly distributing the light emitted by the multiple LEDs 204A, 204B across the display panel 209. The material of the diffuser 208 may include silicone, polycarbonate (PC), polyethylene terephthalate (PET), glass, etc. Furthermore, the diffuser 208 may be a thin, moldable polymer sheet.

In some instances, a third reflective element 210 may be disposed or coated, as shown, either on a surface of the substrate 202 to at least partially cover an area of the surface of substrate 202 between adjacent LEDs (between 204A and 204B) or on a surface of the diffuser 208. The material of the third reflective element 210 may be formed of a reflective material, such as those discussed above with respect to first reflective element 206A and second reflective element 206B, including aluminum, silver, etc. The material of the third reflective element 210 assists in minimizing light absorption or otherwise minimizes emitted light from being negatively affected by the substrate 202, such as passing through substrate 202 between adjacent LEDs in the diffuser 208. In some instances, substrate 202 may be formed of a material that is inherently reflective. Alternatively, there may be no need for a third reflective element, as it may be undesirable for a particular technological purpose. For example, it may be desirable that substrate 202 is transparent or translucent to allow some light emissions through the substrate 202.

A cross-sectional close-up view 212 of LED 204B depicts the reflectivity of light emissions 214, indicating that light emissions 214 may be reflected back and forth between the first reflective element and the second reflective element until reaching lateral sides of the LED 204B. Upon reaching the lateral sides of the LED 204B, the light emissions 214 pass into the diffuser 208. In this manner, nearly all of the emitted light is able to be captured and directed toward the display panel 209, leaving very little amounts of light lost.

Additionally, and/or alternatively, in some instances, reflective element 222 disposed on the side of the LED opposite the substrate 202 may be formed of a material that provides a partially reflective surface while still remaining somewhat translucent so as to permit some light emissions 216 to pass through the reflective surface and out through the display panel 209. For example, the reflective surface may be formed of a very thin layer of silver (e.g., less than a particular thickness).

Also depicted in view 212 of FIG. 2 are conductive pads 218 of the LED 204B, which are used to conduct power and attach the LED 204B to the substrate 202 via circuit trace 220. The circuit trace 220 may be formed from a conductive ink disposed via screen printing, inkjet printing, laser printing, manual printing, or other printing means. Further, the circuit trace 220 may be pre-cured and semi-dry or dry to provide additional stability, while still being activatable for die conductivity purposes. A wet conductive ink may also be used to form the circuit trace 220, or a combination of wet and dry ink may be used for the circuit trace 220. Alternatively, or additionally, the circuit trace 220 may be preformed as a wire trace, or photo-etched, or from molten material formed into a circuit pattern and subsequently adhered, embedded, or otherwise secured to the substrate 202.

The material of the circuit trace 220 may include, but is not limited to, silver, copper, gold, carbon, conductive polymers, etc. In some instances, the circuit trace 220 may include a silver-coated copper particle. A thickness of the circuit trace 220 may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

With respect to the reflective elements of LED 204B as shown in view 212, in some instances, reflective element 222 may extend across an entirety of a width of the LED 204B, or alternatively, a reflective element 224 may extend substantially across or partially across the width of the LED 204B. A reflective element that extends across an entirety of the width of the LED, or a reflective element that extends only partially across a width of the LED may be used on either side of the LED. Additionally, and/or alternatively, both reflective elements within an LED may be the same size and extend all the way across the width of the LED, or partially across the width of the LED.

Figure 3:
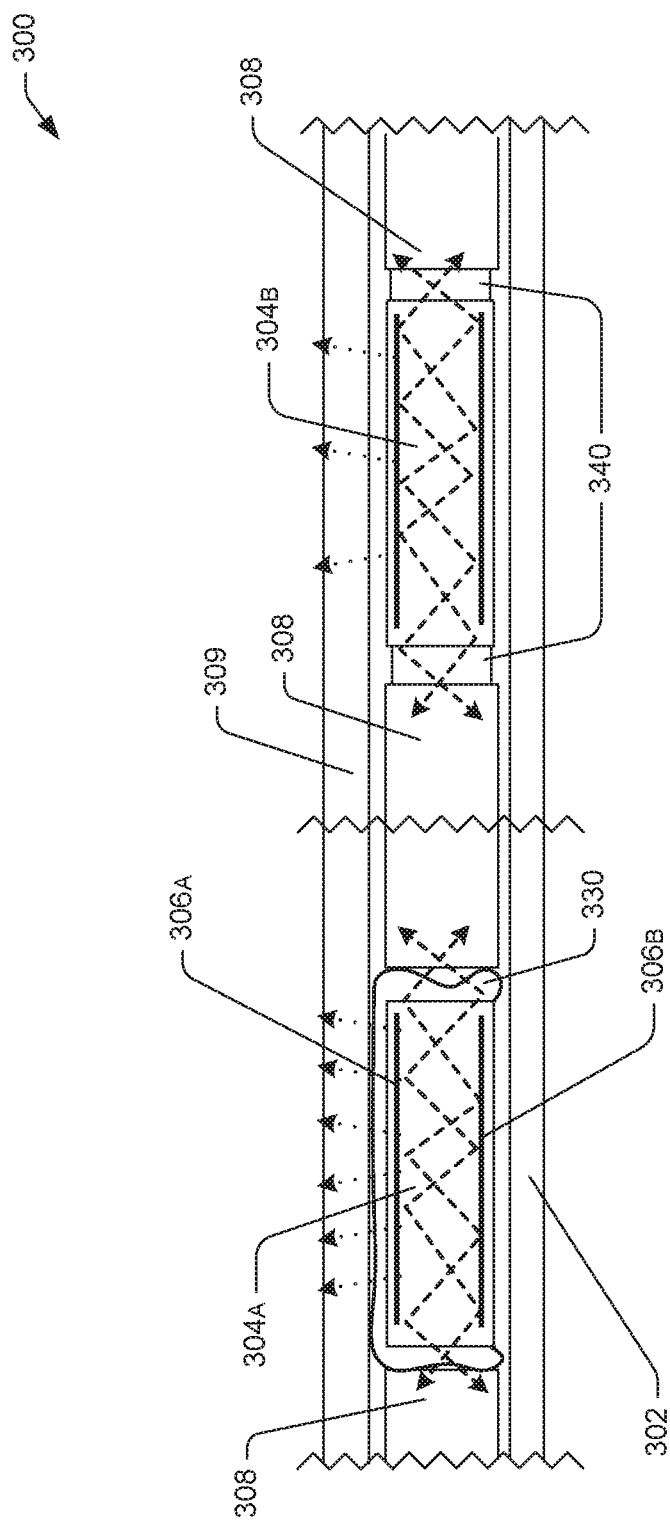
FIG. 3 illustrates a side cross-sectional view of an apparatus according to another embodiment of the instant application.

Similar to FIG. 2, an apparatus 300 depicted in FIG. 3 includes a circuit substrate 302 on which is disposed multiple LEDs 304A, 304B. Each LED 304A, 304B may include reflective surfaces 306A, 306B. A diffuser 308 is aligned with the multiple LEDs 304A, 304B adjacent the substrate 302 so as to nest with the multiple LEDs 304A, 304B. In some instances, substrate 302 may be formed of material that is inherently reflective. Alternatively, there may be no need for a third reflective element, as it may be undesirable for a particular technological purpose. For example, it may be desirable that substrate 302 is transparent or translucent to allow some light emissions through the substrate 302.

As depicted in FIG. 3, a display panel 310 is disposed opposite the substrate 302, thereby sandwiching the nested diffuser 308. Additional details shown in FIG. 3 include variations of optically coupling the LEDs 304A, 304B to the diffuser 308 to enhance light transmission from the light exiting the LED and entering into the diffuser 308. In some embodiments, there may be relatively little or no gap or spacing between edges of the LEDs and the diffuser (relative to the micro size of the LEDs). Thus, in the above embodiment, the optic coupling occurs directly between the lateral sides of the LEDs and the abutting diffuser walls. Note that all figures depict some minimal spacing for the sake of clarity in the description to show the distinction between different components. However, FIGS. 2 and 6 may be representative of no gap or spacing between the LED and the diffuser.

Additionally, and/or alternatively, in some instances, a gap or spacing is intentionally included between the LED 304A and diffuser 308, wherein a different optical coupling may be incorporated. In some instances of an embodiment including a gap, phosphor 330 may be deposited on the LED 304A and around at least the sides the LED 304A so as to optically couple the LED 304A and diffuser 308 by filling in the gap and diffusing the light emissions before the light emissions enter the diffuser 308. Using phosphor is particularly useful when white light is needed. In other instances of an embodiment including a gap, a material 340, such as silicone, phosphor, etc. may be deposited around the sides the LED 304B so as to optically couple the LED 304B and diffuser 308 by filling in the gap and diffusing the light emissions before the light emissions enter the diffuser 308. Note that the quantity of light emissions depicted as passing through a top surface of the LEDs 304A and 304B are different. As previously mentioned, the reflective surfaces 306A and 306B among respective LEDs may differ in transparency ranging from completely opaque to allowing a desired amount of light through to the display panel 310.

Figure 4:
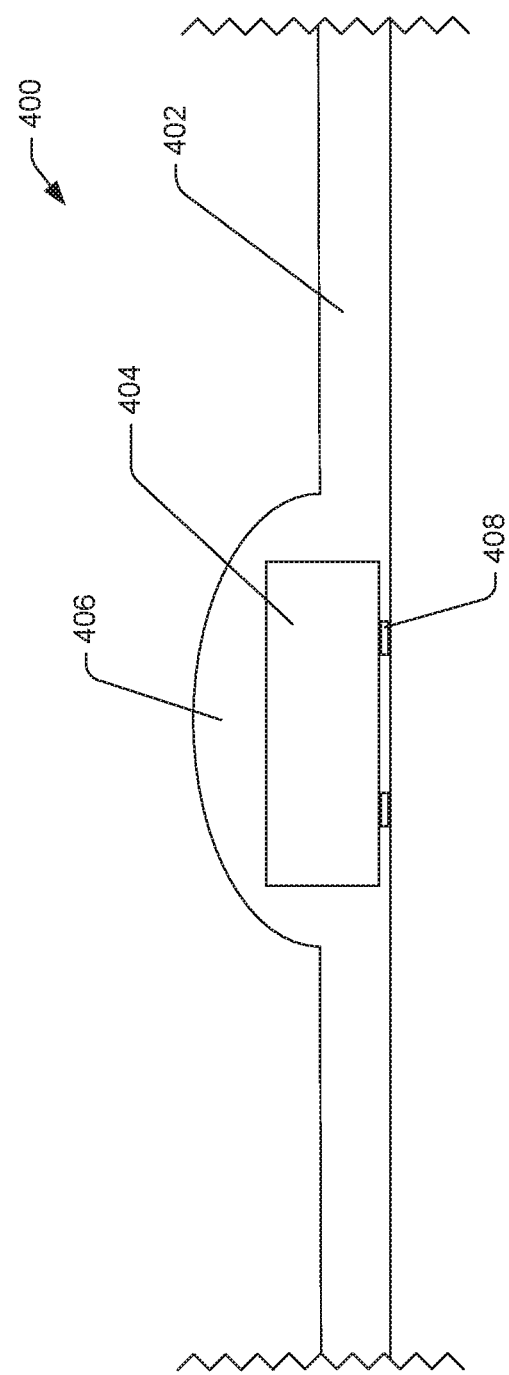
FIG. 4 illustrates a side cross-sectional view of an apparatus according to another embodiment of the instant application.

Moreover, the structural concept of the nested diffuser (208, 308) is contemplated and configured to be used for light distribution and diffusion in a variety of ways. That is, the nested diffuser may be implanted without a display panel and is suited to provide diffused light for devices other than LCDs. In some instances, the nested diffuser includes LEDs nested therein in open cavities or through holes, as depicted in FIGS. 2 and 3. Additionally, and/or alternatively, the LEDs or other light sources may be covered on one or more sides by the material of the diffuser substrate. Moreover, an illustrative embodiment of such a diffuser is apparatus 400 in FIG. 4. Apparatus 400 includes a diffuser substrate 402 having embedded or nested therein a light source 404 (e.g., an LED). An average thickness of the diffuser substrate 402 may be thinner than the height of the light source 404 (e.g., ranging from about 12 microns to about 100 microns, or from about 25 microns to about 80 microns, or from about 35 microns to about 50 microns, etc.). The diffuser substrate 402 may be molded or otherwise formed in raised portion 406 to cover the light source 404 on at least one side thereof. Likewise, a bottom side of the light source 404 may be covered at least partially by the diffuser substrate 402. The light source 404 includes conductive pads 408 with which the light source 404 may be powered.

Furthermore, the light source 404 may or may not include one or more reflective elements like those depicted on LEDs 204A, 204B, 304A, 304B. It is contemplated that the diffuser substrate 402 may include texture features (discussed further herein) to assist in diffusing the light emitted from the light source. For example, in some instances, the diffuser substrate may be as thick or thicker than a height of the nested light source, and a texture may be added to a surface of the diffuser substrate.

Accordingly, the implementation of the nested diffuser discussed herein is not limited to use in an LCD, and the nested diffuser may serve as a planar or substrate diffused light source for a multitude of other uses.

Figure 5:
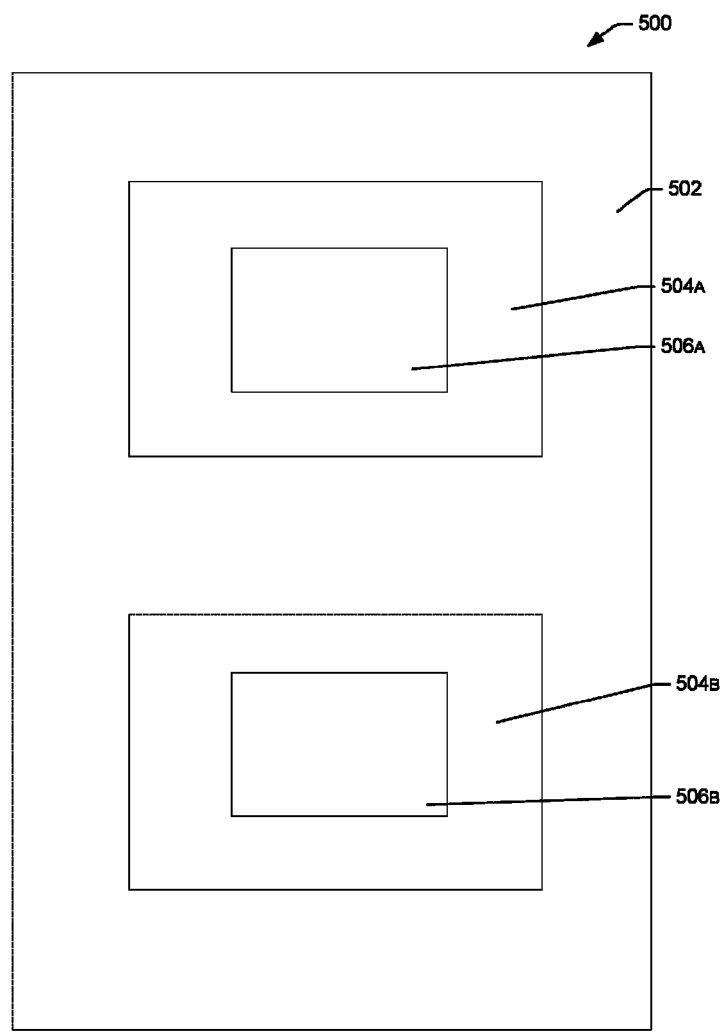
FIG. 5 illustrates a plan view of an apparatus according to an embodiment of the instant application.

FIG. 5 depicts a plan view of an LED 500. LED 500 may include one or more layers of semiconductor material 502 for the production of light. LED 500 further includes current spreading layers 504A, 504B that assist in safely providing power to the LED 500, which power is conducted to the LED 500 via conductive pads 506A, 506B. In some instances, the material chosen for the current spreading layers 504A, 504B may be selected and disposed with the semiconductor material 502 so as to function as a first reflective element on one of the sides of the LED 500, while the opposing side may include a second reflective element. Current spreading layers 504A, 504B are not limited to the relative sizing depicted in FIG. 5. That is, current spreading layers 504A, 504B may be larger or smaller with respect to the conductive pads 506A, 506B depending on desired reflectivity characteristics and required functionality aspects. Furthermore, a thickness of the current spreading layers 504A, 504B may vary to increase or decrease reflectivity.

Figure 6:
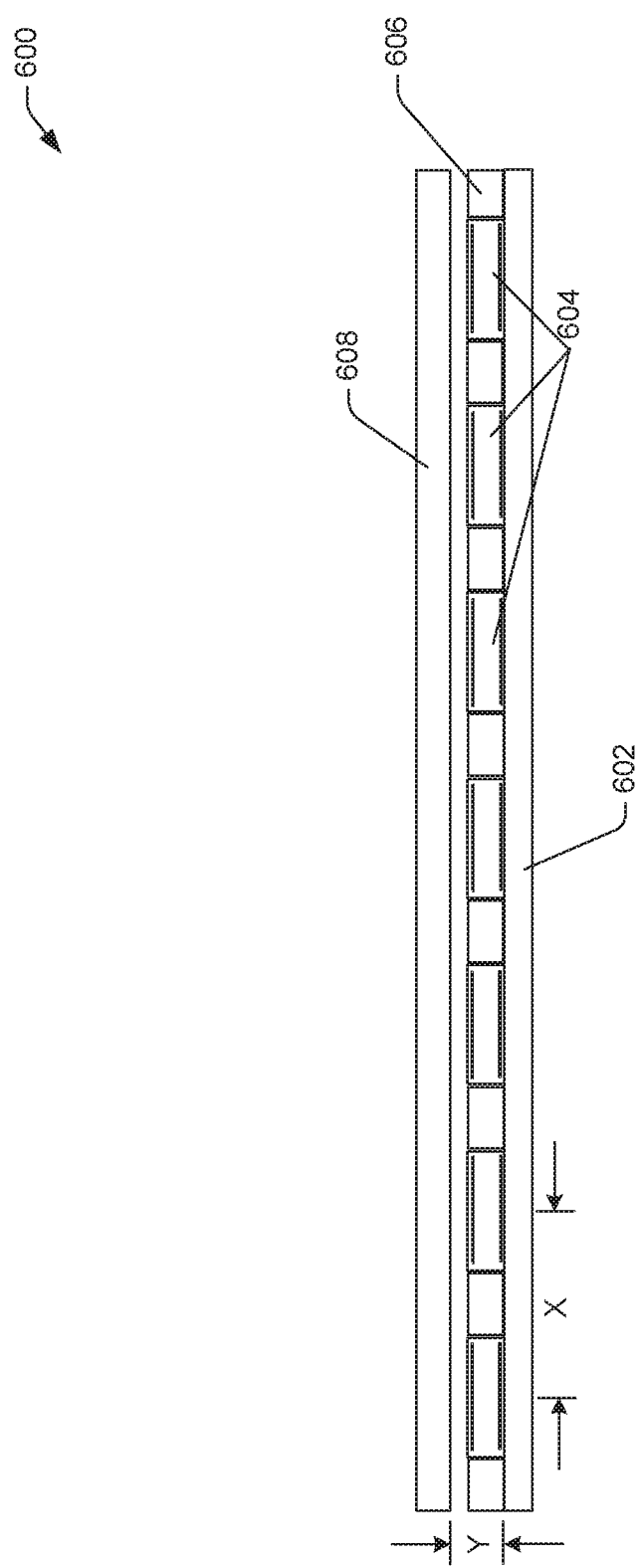
FIG. 6 illustrates a side cross-sectional view of an apparatus according to an embodiment of the instant application.

A side cross-section of apparatus 600, as depicted in FIG. 6, includes a circuit substrate 602 having disposed thereon an array of LEDs 604 nested within a diffuser 606. The LEDs 604 of the array may be LEDs according to the instant application, including a first reflective element and a second reflective element (as shown but not labeled). The optical distance spacing Y between the substrate 602 with the array of LEDs 604 and a display panel 608 may vary depending on a thickness of the LEDs 604 and the effectiveness of the diffusion through diffuser 606. The array of LEDs 604 may be arranged across a surface of the circuit substrate 602 in a matrix having several columns and rows of LEDs 604. (See FIG. 8 for a plan view). The LED spacing distance X between the centroid of adjacent LEDs may vary depending on the size of the LEDs 604 and the effectiveness of diffusion through diffuser 606 and display panel 608. Note that the distance X is ultimately limited by a width of adjacent LEDs. Further, the distance Y is ultimately limited by a height of the LED(s) on substrate 602.

In many instances, spacing of the height between substrate 602 and display panel 608 is interrelated with the spacing between adjacent LEDs 604. The interrelationship varies depending on the number of LEDs used, the effectiveness of the diffusion, the brightness desired, the desired thickness of the device, etc. Ultimately, the goal is to provide uniform lighting across an entirety of the surface of the display panel 608 for a user, while minimizing the number of LEDs to save on cost and power consumption, and minimizing the distance Y between substrate 602 and display panel 608 so as to keep the overall thickness of the display as thin as possible. Generally, as the value of Y decreases, the value of X decreases as well, which means that the number of LEDs in an array increases to uniformly light the display without visually noticeable points of light.

Figure 7:
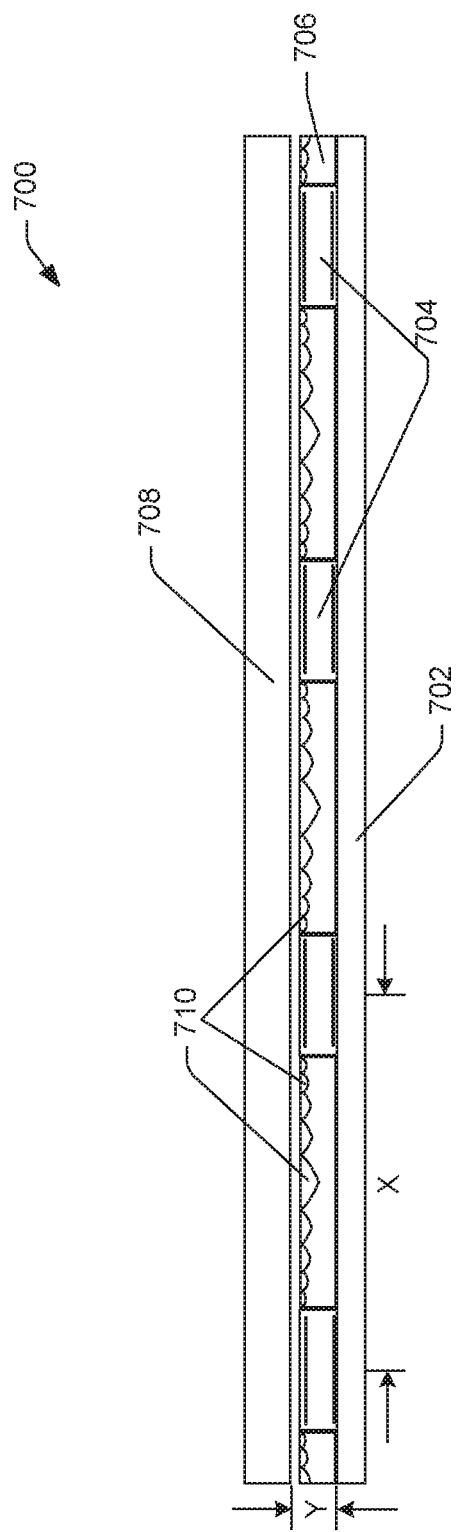
FIG. 7 illustrates a side cross-sectional view of an apparatus according to another embodiment of the instant application.

In order to minimize the number of LEDs needed when reducing the distance Y, a texture may be added to the surface and/or the body of the diffuser. For example, in FIG. 7, a side cross-section VII (see FIG. 8) of apparatus 700 depicts a circuit substrate 702 having an array of LEDs 704 disposed thereon nested in a diffuser 706. A distance Y between substrate 702 and display panel 708 may vary. In some instances, diffuser 706 may include texture features 710. The texture features 710 may be concave toward the substrate 702 as depicted in FIG. 7, or they may be convex (not shown). Additionally, and/or alternatively, the texture features 710 may include a combination of concave and convex structures. The texture features 710 may be organized in a pattern or may be disposed randomly across the surface or within diffuser 706.

It is noted that the texture features 710, depicted as semi-circles in some instances and peaked depressions in other instances in FIG. 7, may be other known or random shapes that are effective for diffusion of light from the LEDs 704. For example, the texture features 710 may be triangular, pyramidal, spherical, rectangular, hexagonal, etc. The shapes of the texture features 710 in FIG. 7 are only representative of example embodiments according to the instant application. Furthermore, though the texture features depicted in FIG. 7 increase in depth as well as breadth depending on the distance away from the LEDs 704, in some instances, only the depth or only the breadth may be varied to achieve uniform diffusion of light. Thus, other contemplated texture features include features having the same breadth, but increasing depth, (e.g., tubular shapes of identical widths and increasing depths into the diffuser); and features having the same depth, but increasing breadth, (e.g., pancake-like depressions of identical depth into the diffuser and increasing breadth across the diffuser varying with distance from a light source.

In addition to the use of a first and second reflective element on the LEDs for diffusing light emitted by the LEDs through a display panel, texture features, such as those described above may work in combination with the reflective elements to provide a more uniformly lit display surface. In some instances, as seen in the plan view of diffuser 706 in FIG. 8, diffuser 706 may include a plurality of texture features 710. In the array, texture features shown on diffuser 706, large circles 800 are representative of the location of LEDs (not shown) nested within diffuser 706. The large circles 800 do not necessarily indicate that the light will be brightest at that location, but rather merely indicate the source of initial distribution of the light emitted from the LED nested in diffuser 706.

An individual texture feature 802 is depicted as a circle at a first radial distance from the centroid of the location of the LED at large circle 800. Another individual texture feature 804 is depicted as a different sized circle at a second radial distance from the centroid of the location of the LED at large circle 800. Note that the texture feature 804 is smaller than the texture feature 802. Further, in the series 806 of texture features, a pattern emerges showing that the texture features closest to the LED (e.g., texture feature 804) are smaller in size than the texture features radially further away from the LED (e.g., texture feature 802). That is, in some instances, as the distance between a texture feature and an LED increases, the size of the texture feature may increase in order to capture and thereby diffuse more light so as to provide uniform illumination through an entirety of the diffuser 706 and the superimposed display panel. In correlation, as the distance between the texture feature and an LED decreases, the size of the texture feature may decrease in order to reduce the amount of light being captured proximate to the light source.

Figure 8:
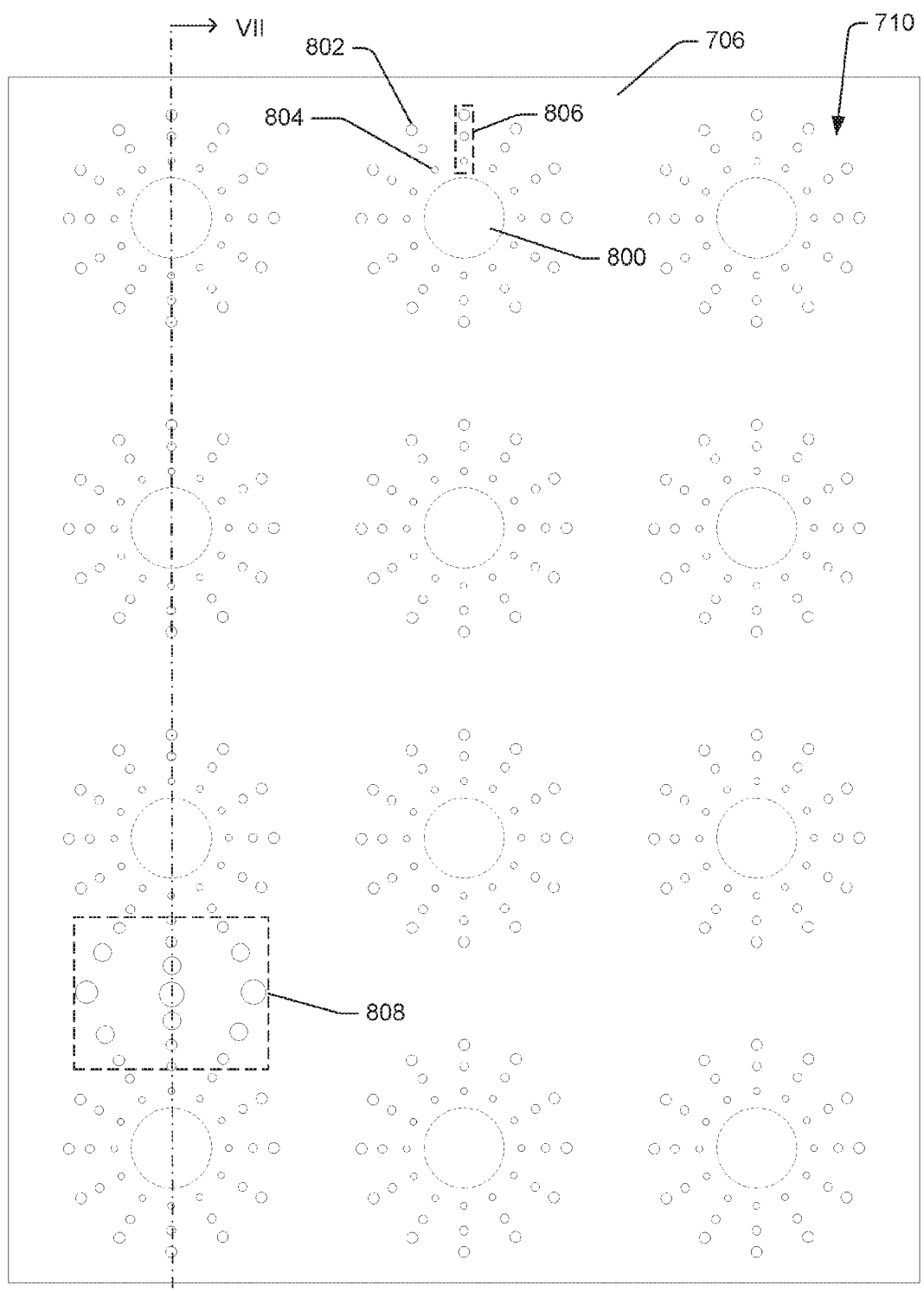
FIG. 8 illustrates a plan view of an apparatus according to an embodiment of the instant application.

Although it appears in FIG. 8 that the texture features do not extend across an entirety of the diffuser 706 (i.e, large gaps without texture features between LEDs), the illustration of FIG. 8 is only intended as an example and is depicted as such, for clarity in the description and to avoid complication in the depiction. Nevertheless, as shown in area 808, it is contemplated that the texture features may extend continuously across an entirety of the diffuser 706. Note that, in some instances of adjacent LEDs, the size of the texture features may reach a maximum size approximately halfway between any two adjacent LEDs. The texture features shown in the middle of area 808, for example, may be considered to be at a maximum size due to their location between laterally adjacent LEDs. For the sake of clarity, two LEDs may be considered laterally adjacent when there are no intervening LEDs nested in the diffuser therebetween. As such, in FIG. 8, LEDs are considered adjacent whether they are disposed diagonally, horizontally, or vertically spaced from each other.

Additionally, and/or alternatively, as indicated previously, the texture features may be randomly located, while evenly distributed so as to maintain uniformity of diffusion. Creation of the texture features may be achieved via laser-etching, knurling, molding, scraping, etc.

Illustrative Embodiment of a Method of Forming an LED

Figure 9:
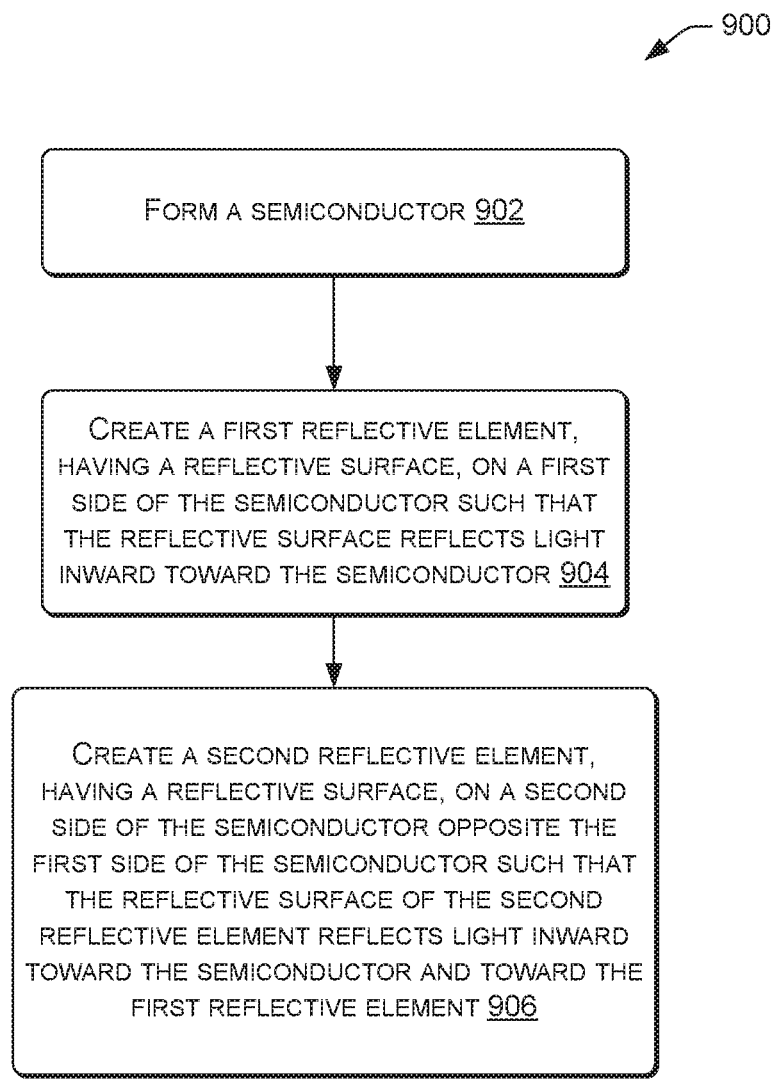
FIG. 9 illustrates an example method according to an embodiment of the instant application.

A method 900 of creating an LED according to an embodiment of the instant application, is depicted in FIG. 9. Method 900 includes a step 902 of forming a semiconductor. In some instances, the step of forming a semiconductor may be similar to those used to form conventional semiconductors for use as LEDs. In other instances, other steps may be performed. Method 900 further includes a step 904 of creating a first reflective element having a reflective surface. The first reflective element is created on a first side of the semiconductor such that the reflective surface reflects light inward toward the semiconductor. Further, at 906, a second reflective element is created having a reflective surface. The second reflective element is created on a second side of the semiconductor opposite the first side of the semiconductor, such that the reflective surface of the second reflective element reflects light inward toward the semiconductor and toward the first reflective element.

In the method 900, the first and second reflective elements may be formed of material such as aluminum, silver, $TiO_2$, $SiO_2$, $HfO_2$, $Ta_2O_5$, or a white diffuse polymer-based reflective material. Furthermore, one or both the first and second reflective elements may be formed in a very thin layer (e.g., less than a threshold distance) such that the reflective element is translucent to some extent while still maintaining a generally reflective surface.

Illustrative Embodiments of a Method of Forming a Nested Diffuser

Figure 10:
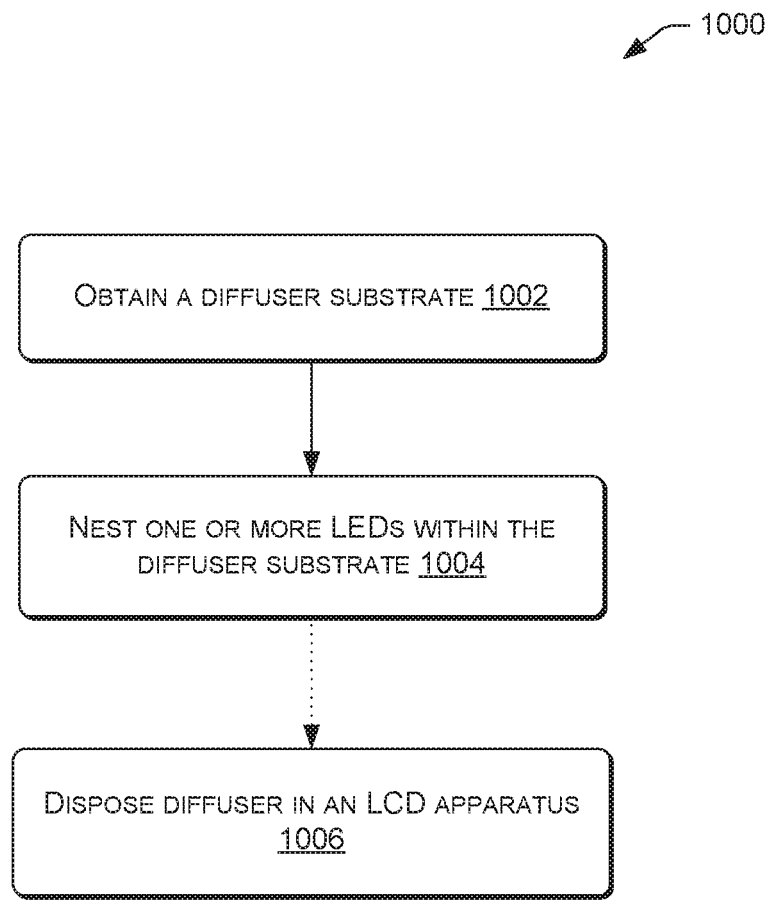
FIG. 10 illustrates an example method according to an embodiment of the instant application.

A method 1000 of creating a nested diffuser according to an embodiment of the instant application, is depicted in FIG. 10. Method 1000 includes a step 1002 of obtaining a diffuser substrate. In some instances, the step of obtaining the diffuser substrate may include additional steps of creating the texture features discussed above on the substrate. Creation of the texture features may be achieved via laser-etching, knurling, molding, scraping, etc. Alternatively, in some instances, texture features may have been previously added to the diffuser substrate, or the diffuser substrate may not include texture features at all. In other instances, other steps may be performed. Method 1000 further includes a step 1004 of nesting one or more LEDs within the diffuser substrate. Step 1004 may be performed before or after attaching the LEDs to the circuit substrate. Further, at 1006, an optional step of disposing the nested diffuser in an LCD apparatus.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter.

What is claimed is:
1. A display apparatus comprising:
   a substrate;
   a plurality of LEDs, each LED having a first side and a second side, each LED being attached to the substrate via conductive pads on the first side of the LED, and each LED including:
      a first reflective element disposed adjacent the first side of the LED so as to reflect light in a direction away from the substrate, and
      a second reflective element disposed adjacent the second side of the LED that opposes the first side of the

LED, the second reflective element disposed so as to reflect light primarily in a direction toward the substrate; and a diffuser having light diffusing characteristics aligned with the plurality of LEDs against a surface of the substrate, the diffuser aligned so as to nest around at least one LED of the plurality of LEDs.

2. The display apparatus according to claim 1, wherein the LED is plurality of LEDs includes a first LED and a second LED spaced apart from each other on the substrate, and wherein a portion of the substrate between the first LED and the second LED includes a reflective surface so as to reflect light in a direction away from the substrate.

3. The display apparatus according to claim 1, wherein the plurality of LEDs includes a first LED and a second LED spaced apart from each other on the substrate.

4. The display apparatus according to claim 1, wherein the material of the diffuser includes at least one of silicone, polycarbonate (PC), or polyethylene terephthalate (PET).

5. The display according to claim 1, wherein the diffuser is formed of a moldable polymer film.

6. The display apparatus according to claim 1, further comprising a conductive trace disposed on the substrate and connected to the conductive pads of each LED of the plurality of LEDs.

7. The display apparatus according to claim 1, wherein the substrate is a printed circuit board (PCB).

8. The display apparatus according to claim 1, wherein at least one of the first reflective element or the second reflective element extend at least partially across a width of at least one of the plurality of LEDs.

9. The display apparatus according to claim 1, wherein at least one of the first reflective element or the second reflective element extends across an entirety of a width of at least one LED of the plurality of LEDs.

10. The display apparatus according to claim 1, wherein at least one of the first reflective element or the second reflective element is formed as a current spreading layer.

11. The display apparatus according to claim 1, wherein a material of at least one of the first reflective element or the second reflective element is one of aluminum, silver, $TiO_2$, $SiO_2$, $HfO_2$, $Ta_2O_5$, or a white diffuse polymer-based reflective material.

12. The apparatus according to claim 1, wherein at least one of the plurality of LEDs has a thickness less than 50 microns.

13. The apparatus according to claim 1, wherein the substrate, at least one of the plurality of LEDs, and the diffuser have a combined thickness less than 170 microns.

14. The apparatus according to claim 1, wherein a thickness dimension of the diffuser is approximately the same as a height dimension of the plurality of LEDs, respectively.

15. The apparatus according to claim 1, wherein the diffuser has a first and a second side, the first side of the diffuser including a reflective surface to reflect light in a direction away from the substrate.

16. An apparatus comprising:
a diffuser substrate; and
an array of LEDs aligned with the diffuser substrate so as to nest within the diffuser substrate, each LED including conductive pads on a first side of the LED, and each LED including:
a first reflective element disposed adjacent the first side of the LED so as to reflect light in a first direction transverse to a plane of the diffuser substrate, and
a second reflective element disposed adjacent a second side of the LED that opposes the first side of the LED, the second reflective element disposed so as to reflect light in a second direction transverse to a plane of the diffuser substrate and opposite the first direction, wherein a thickness dimension of the diffuser substrate is no greater than a height of the array of LEDs.

17. The apparatus according to claim 16, further comprising a circuit substrate attached to the LEDs.

18. The apparatus according to claim 17, wherein the diffuser substrate includes texture features.

19. The apparatus according to claim 16, wherein a surface of the diffuser substrate includes texture features extending circumferentially around at least one LED of the array of LEDs.

20. The apparatus according to claim 19, wherein a size of a largest dimension of a particular texture feature depends on a radial distance between the at least one LED and the particular texture feature.

21. The apparatus according to claim 19, wherein a largest dimension of a first particular texture feature disposed a first radial distance away from the at least one LED is less than a largest dimension of a second particular texture feature disposed a second radial distance away from the at least one LED, the first radial distance being shorter than the second radial distance.

22. The apparatus according to claim 16, wherein a surface of the diffuser substrate includes texture features extending circumferentially around each LED of the array of LEDs, and wherein a size of each texture feature depends on a radial distance from one or more LEDs.

23. The apparatus according to claim 22, wherein a depth and/or a breadth of a particular texture feature disposed halfway across a distance between two adjacent LEDs is greater than a corresponding depth and/or breadth of a texture feature located less than the distance that is halfway between the two adjacent LEDs.

24. An apparatus comprising:
a circuit substrate;
a display panel disposed substantially parallel to the circuit substrate;
a diffuser substrate disposed between the circuit substrate and the display panel; and
an array of LEDs in columns and rows nested across a plane of the diffuser substrate so as to be aligned with the diffuser substrate and attached to the circuit substrate, each LED being attached via conductive pads on a first side of the LED, and each LED including at least one of:
a first reflective element disposed adjacent the first side of the LED so as to reflect light in a first direction transverse to a plane of the diffuser substrate, or
a second reflective element disposed adjacent a second side of the LED that opposes the first side of the LED, the second reflective element disposed so as to reflect light in a second direction transverse to a plane of the diffuser substrate and opposite the first direction, wherein the diffuser substrate includes texture features extending circumferentially around one or more LEDs of the array of LEDs.

* * * * *